(12) United States Patent
Dang et al.

(10) Patent No.: US 7,061,074 B2
(45) Date of Patent: Jun. 13, 2006

(54) VISIBLE IMAGING DEVICE USING DARLINGTON PHOTOTRANSISTORS

(75) Inventors: Khoa V. Dang, Springfield, VA (US); Conrad W Terrill, Lorton, VA (US)

(73) Assignee: The United States of America as represented by the Dept of the Army, Washington, DC (US)

( * ) Notice: Subject to any disclaimer, the term of this patent is extended or adjusted under 35 U.S.C. 154(b) by 0 days.

(21) Appl. No.: 10/962,813

(22) Filed: Oct. 7, 2004

(65) Prior Publication Data

US 2006/0076646 A1    Apr. 13, 2006

(51) Int. Cl.
*H01L 27/082* (2006.01)

(52) U.S. Cl. .............. 257/567; 257/568; 257/569; 257/571; 257/573; 257/575

(58) Field of Classification Search ......... 257/567, 257/568, 569, 571, 573, 575
See application file for complete search history.

(56) References Cited

U.S. PATENT DOCUMENTS

| | | | | |
|---|---|---|---|---|
| 3,925,879 A | * | 12/1975 | Weinstein | 438/7 |
| 4,282,464 A | * | 8/1981 | Uzuka | 318/138 |
| 2005/0045804 A1 | * | 3/2005 | Park et al. | 250/208.1 |

* cited by examiner

*Primary Examiner*—Minhloan Tran
*Assistant Examiner*—Tan Tran
(74) *Attorney, Agent, or Firm*—William H. Anderson; Andrew Romero

(57) ABSTRACT

The present invention is a modified darlington phototransistor wherein a phototransistor is coupled to a Bipolar Junction Transistor (BJT). This design provides a high sensitivity and a fast response and effectively increases the gain of the photocurrent. This circuit is particularly will suited for the readily available CMOS and Bipolar Complementary Metal Oxide Semiconductor (BiCMOS) processes prevalent today.

8 Claims, 3 Drawing Sheets

VISIBLE IMAGING DEVICE USING DARLINGTON PHOTOTRANSISTORS

GOVERNMENT INTEREST

The invention described herein may be manufactured, used, sold, imported, and/or licensed by or for the Government of the United States of America.

FIELD OF INTEREST

This invention relates to visible imaging technology that uses a modified Darlington phototransistor circuit to act as an improved photodetector.

BACKGROUND OF THE INVENTION

Current visible imaging technology is mostly based on Charge Couple Device (CCD) structures. CCDs are based on a Metal Oxide Semiconductor (MOS) technology where charge is transferred from one capacitive well to another thus requiring large capacitances and power. Complementary Metal Oxide Semiconductor (CMOS) imagers are a viable alternative to CCDs. CMOS technology is currently used in almost all of the microprocessors, integrated circuits and memory products. Taking advantage of the available CMOS tools of rapid simulation, testing and fabrication, lower cost, lower power, higher performance imagers can be developed. Photodiodes and phototransistors are common types of detectors used in CMOS imagers. However, they are limited in sensitivity.

Darlington phototransistors have also been recognized as photodetectors. A Darlington phototransistor is an integrated two-stage amplifier device that can obtain a larger current capacity than a typical phototransistor. In the usual Darlington phototransistor, the emitter of a typical phototransistor is connected directly to the base of another transistor that shares a common collector. The collector-emitter current of the one phototransistor is the base current for the second transistor. Thus, the light-induced current is effectively amplified by $\beta^2$. With known Darlington phototransistors, the second transistor can be driven into saturation with moderate levels of actuating light, which is beneficial over usual phototransistors. However, this is where the benefits of known Darlington phototransistor end.

Therefore, there exists a need in the art to provide a means to produce visible imaging devices that are cheaper, are readily simulated and tested, are lower power, and are more sensitive than existing devices. The present invention addresses such a need.

SUMMARY OF THE INVENTION

Accordingly, one object of the present invention is to provide a cheaper, readily simulated and tested, lower power, and more sensitive visible imaging device. This and other objects of the present invention are accomplished by coupling a phototransistor to a Bipolar Junction Transistor (BJT). This design provides a high sensitivity and a fast response by coupling the BJT to the phototransistor in a "Darlington" configuration to effectively increase the gain of the photocurrent. According to the present invention, the emitter of the phototransistor is connected to the base of a bipolar transistor. The emitter of the bipolar transistor is then connected to an integration capacitor, $I_C$. Therefore, with the present invention the photocurrent is effectively increased by 100 times. The emitter current of the phototransistor becomes the base current of the bipolar transistor. The $\beta$ value of q2 is around 100, thus the emitter current of bipolar transistor is 100 times the base current of bipolar transistor or the photocurrent.

This circuit is particularly well suited for the readily available CMOS and Bipolar Complementary Metal Oxide Semiconductor (BiCMOS) processes prevalent today.

BRIEF DESCRIPTION OF THE DRAWINGS

These and other objects of the invention will become readily apparent in light of the Detailed Description Of The Invention and the attached drawings wherein.

DETAILED DESCRIPTION OF THE INVENTION

The present invention is based on a Darlington phototransistor that takes in incident light and converts it into electrical current so that is acts as a photodetector. The present invention is made of two main elements that serve as the photodetector. Here, a phototransistor is coupled to a Bipolar Junction Transistor (BJT) in a Darlington configuration. This design provides a high sensitivity and a fast response by coupling the BJT to the phototransistor to effectively increase the gain of the photocurrent. This circuit is particularly well suited for the readily available CMOS and Bipolar Complementary Metal Oxide Semiconductor (BiCMOS) processes prevalent today.

In the present invention, the Darlington phototransistors are sensors that produce a photocurrent that is proportional to the incident photons absorbed. Photons are absorbed in the base-emitter and the base collector areas thereby producing electron-hole pairs. The electron-hole pairs are then split apart by the electrical field present at the p-n junctions (depleting areas). The holes are then pulled into the p region and electrons into the n-type region. The action of the holes and electrons moving to their prospective n and p regions contribute to a base current. The collector current is determined by the expression:

$$I_C = \beta I_B$$

Where $I_C$ is the collector current and $I_B$ is the base current. The $\beta$ value (also commonly referred to as $h_{fe}$ value) is determined by two factors: the width of the base region and the relative dopings of the emitter region and the base region. To achieve a high $\beta$ value (which is desirable in this case) the base should be thin and lightly doped while the emitter should be heavily doped. When using commercial foundry processes, there is no ability to control the various dopings and diffusions (these are controlled and defined by the foundry). However, it is possible to control the geometry of the base areas and emitter areas. For typical CMOS processes today, a β value of 100 should be achievable. The emitter current can be derived by the following equations:

$$I_E = I_C + I_B \text{ (Kirchoff's current rule)}$$

$$I_E = I_C + I_C/\beta$$

$$I_E = I_C(1 + 1/\beta)$$

Therefore for large values of β, $I_E$ is approximately equal to $I_C$.

In terms of photon-generated electrons (photocurrent), the bipolar Darlington phototransistor detector should generate one hundred electrons for every photon absorbed into the structure. Efforts were made to increase the sensitivity of phototransistors according to the present invention or to boost the photocurrent gain by building CMOS amplifiers to couple to these devices, however, this added complexity and power consumption to the pixel design. In the design of the present invention, the gain of the photocurrent is increased by a factor of 100 using a simple scheme that adds minimum complexity and power.

Figure 1:
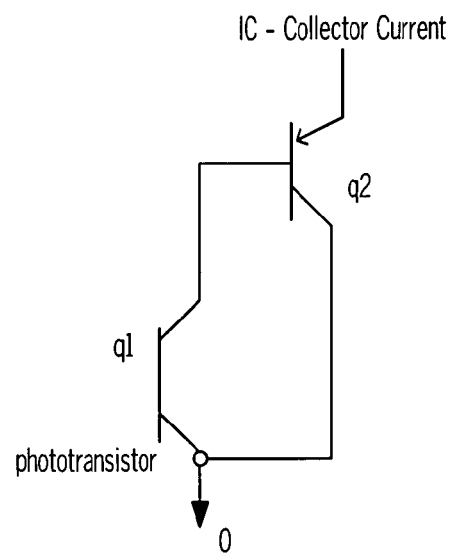
FIG. 1 is a schematic representation of the general circuit layout of the Darlington phototransistor according to present invention.

As shown in FIG. 1, the emitter of the phototransistor q1 is connected to the base of a second bipolar transistor q2. The emitter of the second bipolar transistor is then connected to the integration capacitor, $I_C$. Therefore, with the present invention the photocurrent is effectively increased by 100 times. The emitter current of the phototransistor q1 becomes the base current of the bipolar transistor q2. The β value of q2 is around 100, thus the emitter current of q2 is 100 times the base current of q2 or the photocurrent.

Figure 2:
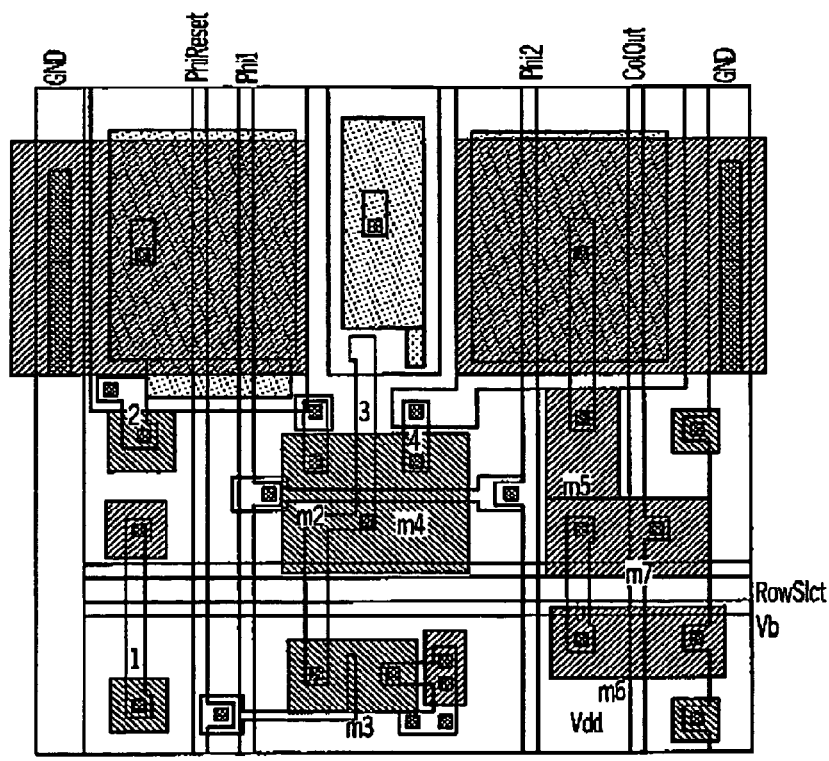
FIG. 2 is a top view of an individual pixel of a visible imaging array according to the present invention.

A 30×30 visible imaging array of Darlington phototransistors was made in accordance with the present invention. FIG. 2 shows a layout of the Darlington phototransistor unit pixel made. The unit pixel 1 includes a Darlington phototransistor coupled to an integration capacitor C1. Metal 2 covers the whole array except areas where the phototransistor regions are. The light shield is necessary to prevent unwanted photoelectric effects. In the Darlington phototransistor design of the present invention, only the n well base and p implanted emitter are exposed to light. The layout of the Darlington phototransistor portion of the unit pixel is detailed in FIG. 3a.

The visible imaging array of the present invention has been made using the AMI CMOS 1.2 um double poly, 2 metal, N well process. The chips were fabricated through the MOSIS foundry service, which is a Department of Defense Advanced Research Projects Agency (DARPA) sponsored multiproject, shared cost fabrication service. The size of the array was 2.2 mm×2.2 mm consisting mainly of the 30×30 pixel circuitry, row and column shift registers, and output amplifier (All as shown in FIG. 2). The function of the row and column shift registers (PhiReset to Phi2)is to take the signal response from all the pixels and serially shift them out onto one output.

Figure 3A:
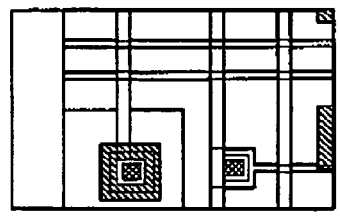
FIG. 3a is a detail of the top view of FIG. 2 showing a single Darlington phototransistor and FIG. 3b is a cross-section of the detail shown in FIG. 3a through Line 3a and 3a' of FIG. 2.
Figure 3B:
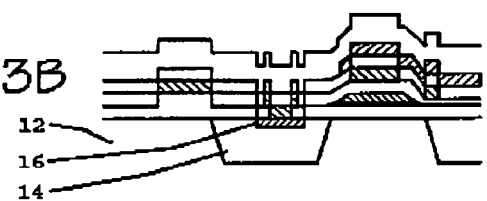

FIG. 3b shows a cross section of the detail of FIG. 3a through line 3a and 3a'. The pnp phototransistor structure of the present invention may fabricated as follows:

The substrate 12 is p-type material, which will act as the collector. The n-well diffusion region 14 is created to make the base. To make the emitter 16, a p-type diffusion is implanted inside the n-well 14. The n-well base 14 surrounds the p-implanted emitter 16. The base 14 of the phototransistor is left floating or in other words is not tied to a voltage bias. The collector, which is the substrate of the present invention, is tied to the ground. The emitter is then connected to an integration capacitor, $I_c$.

Figure 4:
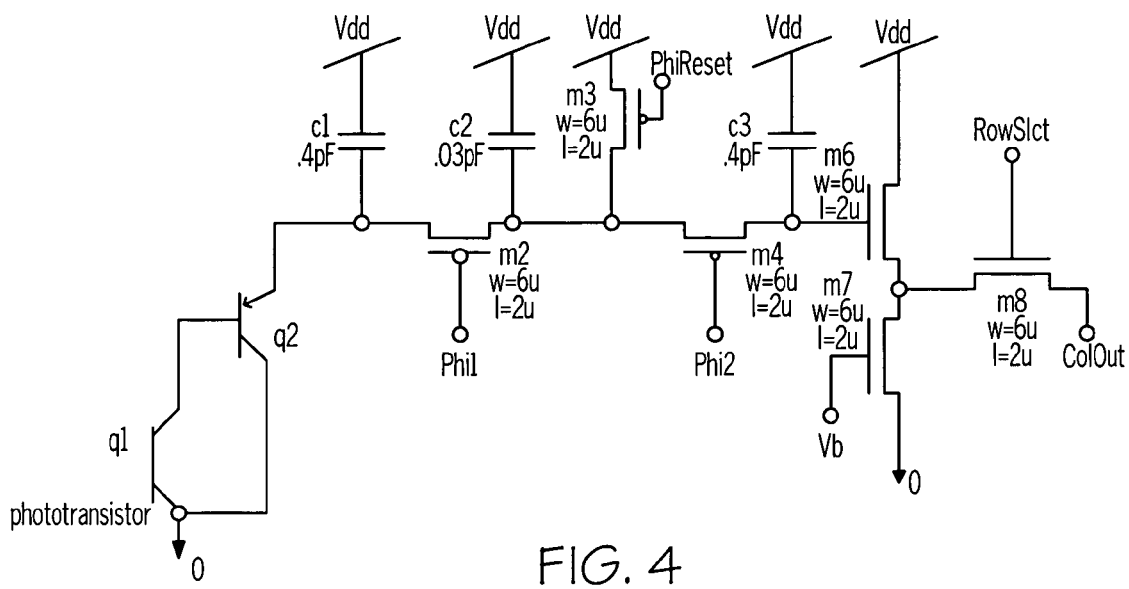
FIG. 4 is schematic representation of the unit pixel circuitry according to the present invention.

FIG. 4 is schematic representation of the unit pixel circuitry according to the present invention. The darlington phototransistor (CMOS imager) is designed to operate in one of two available modes: the "RSD" (ramp, sample and dump) mode, and the extended charge-handling mode. The RSD mode is as follows:
  I. Collect photon-generated electrons from the darlington photodetectors onto the integration capacitor,
  II. Sample or transfer the charge on the integration capacitor to hold the capacitor,
  III. Reset the integration capacitor, and
  IV. While reading out the transferred charge on the hold capacitor, start the integration period again.

Figure 5:
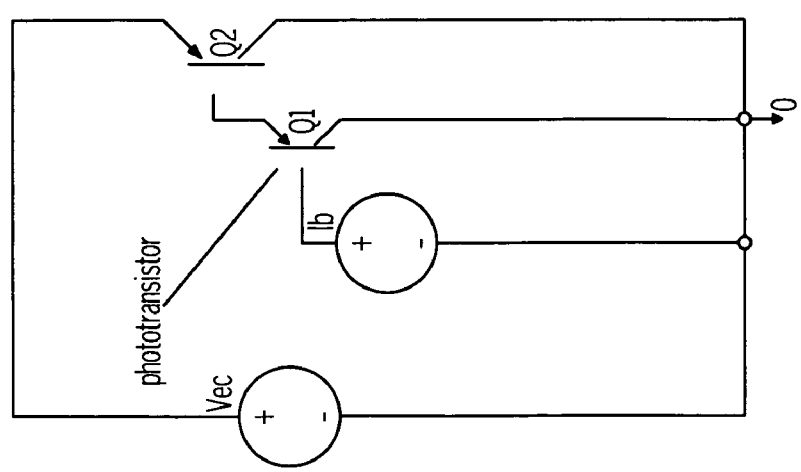
FIG. 5 is a schematic representation of the current flow through the present invention.

In this mode, Phi1 is tied low, thus the Metal Oxide Semiconductor Field Effect Transistor (MOSFET) m2 (See FIG. 2) is acting as a closed switch. C1 and C2 act as the integration. After a certain integration period, where the Darlington phototransistor is allowed to charge up C1 and C2, the charge is sampled and held or transferred onto the hold capacitor C3. Asserting Phi2 low momentarily does this. Phi2 is normally high or in other words MOSFET m4 is normally open. Once the charge has been transferred to the hold capacitor, PhiReset is strobed low thus resetting the integration capacitor C1 and C2 to Vdd. At this point, C1 and C2 can start integrating again, and at the same time the charge on the hold capacitor of each pixel can be read out. MOSFETs M6 and M7 (See FIG. 2) in the unit pixel design makes up the source follower amplifier that prevents the parasitic capacitances of the column bus to load down the Darlington phototransistor circuitry. As shown in FIG. 5, the emitter of the phototransistor is connected to the base of Q2.

The second mode of operation that is available with the present invention is the extended charge handling capability. This is done using the switched capacitor scheme. C1, C2 and C3 along with MOSFET M2, M3 and M4 (See FIG. 2) in the pixel makes up the switched capacitor circuit. The idea behind the switched capacitor circuit is that the signal from the photodarlington detector is sampled linearly over several subframes while the detector noise adds as the square root. A portion of each sub-frame is sampled and stored on the hold capacitor C3, then the remaining portion is reset and a new subframe is begun. The switched capacitor approach will effectively allow for an increase in the charge handling capability by improving the signal to noise ratio (i.e. the signal adds linearly while the noise adds as the square root.)

Figure 6:
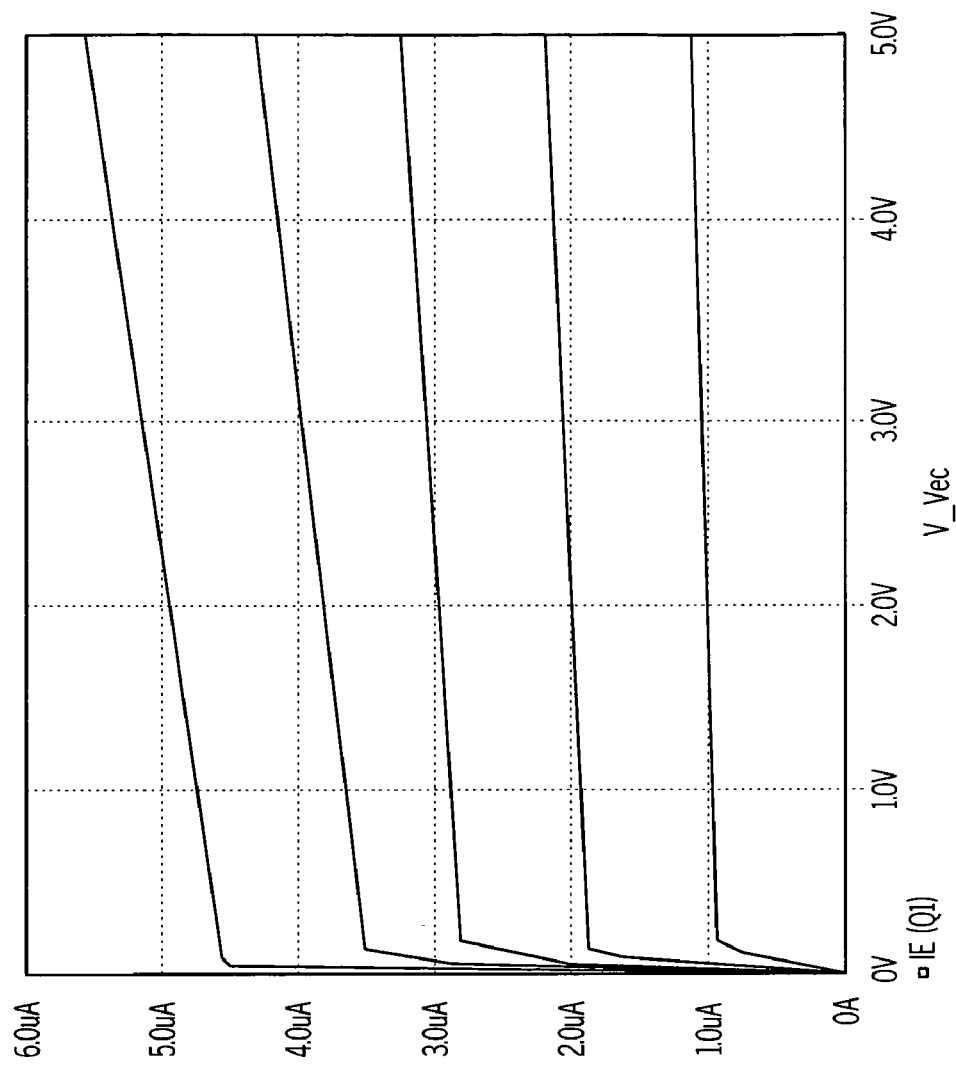
FIG. 6 is a graph of a Spice simulation performed on a visible imaging array according to the present invention.

FIG. 6 shows a Spice simulation of the Darlington phototransistors. In the simulation, the photocurrent of the pnp phototransistor was ramped from 10 nA through 50 nA at 10 nA increments. The curves obtained from the simulation shows the plot of the emitter current Q2 with respect to Vec (voltage between the emitter and the collector). The β value of q2 was set to 90, which is something that should be attainable with today's commercial processes. The curves show that indeed a gain of 90 times the photocurrent is achieved with the present invention.

What is claimed is:
1. A photodetector comprising:
  a phototransistor having an emitter and a base;
  a bipolar transistor having a second emitter and a second base;
  a first Metal Oxide Semiconductor Field Effect Transistor (MOSFET) which acts as a closed switch when the first MOSFET is tied low;
  a first integration capacitor wherein after a certain integration period, where the Darlington phototransistor is allowed to charge up, the first integration capacitor and a second integration capacitor sample the charge which is then held onto a hold capacitor; and a second MOSFET which acts as a closed switch when the second MOSFET is tied low;

wherein the emitter of the phototransistor is connected to the second base of the bipolar transistor, wherein an emitter current of the phototransistor becomes a base current of the bipolar transistor, wherein the second emitter is connected to the first integration capacitor; and wherein once the charge has been transferred to the hold capacitor, a reset MOSFET is strobed low thus resetting the first and second integration capacitors to a voltage Vdd.

2. The photodetector of claim 1 further comprising a substrate, which is a p-type material and acts as a collector forte photodetector.

3. The photodetector of claim 1 wherein the base of the phototransistor is an n-well diffusion region and the emitter is a p-type diffusion implanted inside the n-well diffusion, such that the n-well diffusion region surrounds the p-implanted emitter.

4. The photodetector of claim 1 wherein the base of the phototransistor is not tied to a voltage bias.

5. The photodetector of claim 1 wherein the collector is tied to a ground.

6. The photodetector of claim 1 wherein a $\beta$ value of the bipolar transistor is around 100, thus the emitter current of bipolar transistor is 100 times the base current of bipolar transistor or a photocurrent.

7. The photodetector of claim 1 wherein after the first and second integration capacitors are reset, the first and second integration capacitors can start integrating again, and at the same time the charge on the hold capacitor can be read out.

8. The photodetector of claim 7 further comprising third and fourth MOSFETs, which make up a source follower amplifier that prevent the parasitic capacitances of a column bus to load down circuitry of the photodetector.

* * * * *